United States Patent [19]

Lafuze

[11] 3,745,471

[45] July 10, 1973

[54] MULTIPLE OUTPUT FREQUENCY REFERENCE WAVE GENERATOR

[75] Inventor: David L. Lafuze, Fairview, Pa.

[73] Assignee: General Electric Company, Wilmington, Mass.

[22] Filed: Dec. 28, 1971

[21] Appl. No.: 213,129

[52] U.S. Cl. .................... 328/61, 328/110, 328/141, 328/41

[51] Int. Cl. .................... H03k 3/78

[58] Field of Search .................... 328/133, 134, 41, 328/61, 39, 141, 109, 110; 307/233, 271

[56] References Cited

UNITED STATES PATENTS

| | | | |
|---|---|---|---|
| 3,038,130 | 6/1962 | Gordon | 328/140 X |
| 3,293,559 | 12/1966 | Howard et al. | 307/271 X |
| 3,297,952 | 1/1967 | Thylander | 328/61 |
| 3,450,991 | 6/1969 | Hornoch | 328/133 X |
| 3,529,246 | 9/1970 | Kaps et al. | 307/233 X |
| 3,675,136 | 7/1972 | O'Brien | 328/133 |

*Primary Examiner*—John S. Heyman

*Attorney*—Robert P. Cogan, I. David Blumenfeld et al.

[57] ABSTRACT

A multi-frequency reference wave generator is provided in which first and second frequency sources are coupled respectively to first and second inputs of a discriminator. The discriminator provides an output equal to the difference of the frequencies at the first and second inputs. A third frequency source is provided having a selectable frequency and coupled for modifying the signal appearing at the first input of the discriminator, whereby a selectable output frequency is provided.

12 Claims, 5 Drawing Figures

MULTIPLE OUTPUT FREQUENCY REFERENCE WAVE GENERATOR

BACKGROUND OF THE INVENTION

This invention relates to reference wave generators.

A reference wave generator has been provided including first and second frequency sources which are connected to provide an output equal to the difference of the first and second frequencies respectively provided by the first and second sources. The reference wave generator may provide a commonly used high frequency reference wave, for example, 400 Hz. It is often desirable to obtain other commonly used frequency reference waves, e.g., 50 Hz or 60 Hz, by incorporating additional circuitry. For example, a 50 Hz reference wave may be obtained by dividing both the frequencies used to derive a 400 Hz reference wave by 8. However, in order to provide a satisfactory signal for many applications, a good deal more filtering circuitry must be included than in the original circuit without the frequency divider. Also, there is no integral division to provide a 60 Hz signal.

SUMMARY OF THE INVENTION

It is, therefore, an object of the present invention to provide a simple and reliable multi-frequency reference wave generator requiring no additional filtering on its output for lower frequencies.

It is also an object of the present invention to provide a multi-frequency reference wave generator with a minimum amount of circuitry additional to that of a single frequency reference wave generator.

It is a further object to provide a multi-frequency reference wave generator having conveniently selectable output frequencies which are not necessarily integral multiples of each other.

Briefly stated, in accordance with the present invention, there is provided a multi-frequency reference wave generator in which first and second frequency sources are coupled respectively to first and second inputs of a discriminator. The discriminator provides an output equal to the difference of the frequencies at the first and second inputs. A third frequency source is provided having a selectable frequency and coupled for modifying the signal appearing at the first input of the discriminator, whereby the selectable output frequency is provided.

BRIEF DESCRIPTION OF THE DRAWINGS

The foregoing objects and features of novelty are embodied in the circuitry pointed out with particularity in the claims forming the concluding portion of the specification. The invention, both as to its organization and manner of operation may be further understood by reference to the following description taken in connection with the following drawings.

Of the drawings.

DESCRIPTION OF THE PREFERRED EMBODIMENT

Figure 1:
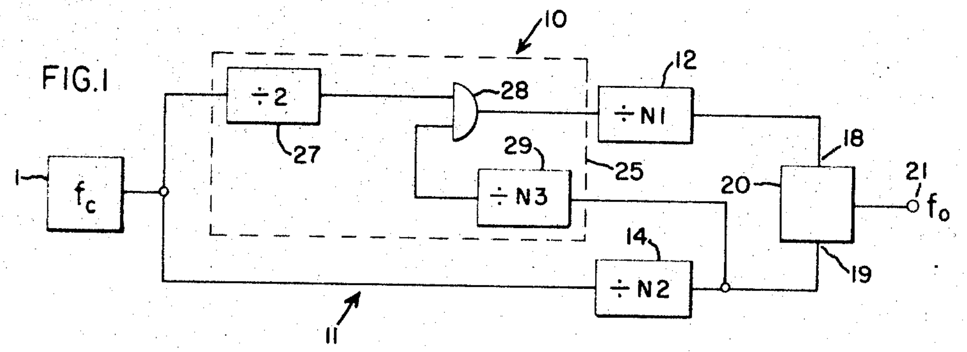
FIG. 1 is a schematic illustration of a preferred embodiment of the present invention.

Referring now to FIG. 1, there is illustrated a reference wave generator constructed in accordance with the present invention. A clock source 1 providing a cock frequency fc has an output coupled to a first channel 10 and a second channel 11. Each channel 10 and 11 comprises means for dividing the frequency of the clock source 1 by a different divisor. Alternatively, the channels 10 and 11 may be viewed as comprising independent first and second frequency sources.

In the channel 10, a first frequency divider 12 providing a divisor of N1 is coupled in series with the clock source 1. In the channel 11, a second frequency divider 14 providing a divisor N2 is coupled in series with the clock source 1. The outputs of the frequency dividers 12 and 14 are respectively coupled to first and second inputs 18 and 19 of a discriminator 20 having an output terminal 21.

Means 25 for modifying the number of input pulses to first input 18 of the discriminator 20 is coupled in series therewith. The means 25 may be coupled either between the clock source 1 and the frequency divider 12 or between the frequency divider 12 and the discriminator 20. In the present embodiment, the means 25 comprises a divide by 2 flip-flop 27 having its input coupled to the frequency source 1 and its output coupled to the first input of an OR gate 28 which has its output connected to the input of the frequency divider 12. The second input of the OR gate 28 is connected to a third frequency divider 29 having an input coupled to the output of the frequency divider 14. Here again, the frequency divider 29 may be viewed as a frequency divider dividing the output of the frequency divider 14. Alternatively, the frequency divider 29 may be viewed as an independent third frequency source which, in the present embodiment, is synchronized by the output of the frequency divider 14. It is noted that the inclusion of the divide by 2 flip-flop 27 is not essential to the functioning of the present embodiment since this function could be incorporated in the frequency divider 12. The flip-flop 27 Is included here, however, because this function is incorporated in the embodiment of the means 25 illustrated in FIG. 2.

Essentially, the frequency dividers 12 and 14 divide input frequencies thereto *fc* by first and second divisors N1 and N2 respectively in order to provide inputs of different frequencies to the inputs 18 and 19 of the discriminator 20. An output frequency *Fo* equal to the difference of the frequencies applied to the input terminals 18 and 19 appears at the output terminal 21. *Fo* is a selectable output frequency. The present multiple frequency reference generator is achieved by utilizing the means 25 to etither insert or blank a selected number of pulses in the channel 10 to provide a frequency different from *fc*/2 divided by N1 to provide a selected reference wave output frequency. There are two primary advantages of this implementation over simply dividing the output frequency *Fo* to obtain multiple selected reference wave output frequencies. The output at the terminal 21 will have the same ripple frequency irrespective of the selected *Fo*. Therefore, no change in the filtering means including in the utilization means (not shown) is required for a change in *Fo*. Further, the present invention allows for nonintegral divisions of the output frequency *Fo* which would not be obtained simply by the operation of the frequency dividers 12 and 14.

OPERATION OF THE CIRCUIT

Let it be assumed that it is desired to obtain an *Fo* of 400 Hz due to operation of the frequency dividers 12 and 14 and the discriminator 20. Let it further be assumed that it is desired to obtain selectable reference wave outputs of 50 Hz and 60 Hz. A clock frequency of 6.125 MHz is chosen, and is provided by any convenient means, such as a crystal oscillator. N1 is chosen to be 88, and N2 is chosen to be 174. No pulses are supplied by the frequency divider 29, and the gate 28 couples pulses directly from the divide by 2 flip-flop 27 to the frequency divider 12. As stated before, the output frequency Fo is equal to the difference of the inputs frequencies applied to the inputs 18 and 19 respectively. Expressed algebraically:

*Fo* = 6,125,000 (1/174 − (1/2) (1/88)) Hz
*Fo* = 6,125,000 ((176) − 174)/174 (176) Hz
*Fo* = 6,125,000 (2)/174(176)
*Fo* = 400 Hz

Figure 2:
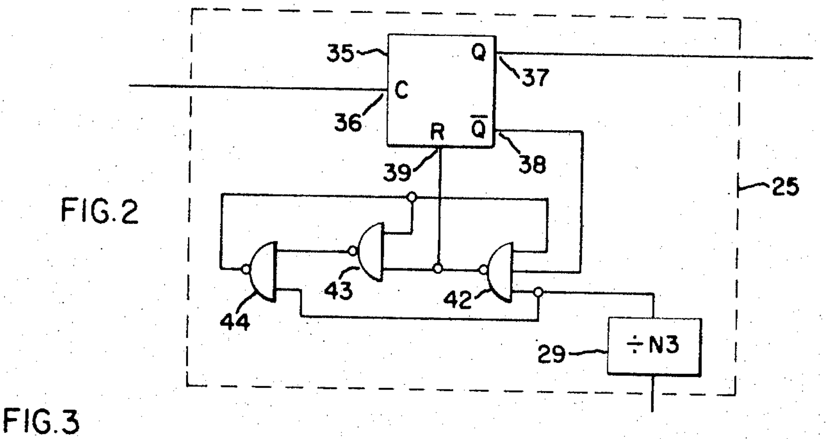
FIG. 2 is a schematic illustration of one implementation of the means for modifying the number of input pulses to the first input of the discriminator of FIG. 1.

For example, it is decided to select an output frequency *Fo* of 50 Hz rather than 400 Hz, a divisor in N3 in the embodiment of FIG. 1 is chosen of 7/8th. Thus, an extra count is added into the divide by 176 path, the channel 10, after the first division by two, for seven out of eight cycles of the divide by 174 path, the channel 11. This is illustrated in FIG. 2.

Consequently, *Fo* is derived as follows:

*Fo* = 6,125,000 (1/174 − 1/88 (1/2 + 7/8 1/174)) Hz
= 6,125,000 (176 − 174 − (7/4)/174(176)) Hz
= 6,125,000 ((1/8) (2/174) $_{(176)}$ ) Hz
= 1/8(400) Hz
= 50 Hz

Similarly, if it is desired to provide an output frequency *Fo* of 60 Hz, an N3 of 17/20 is chosen. Consequently, an extra pulse is coupled to the channel 10 at the input of the frequency divider 12 for 17 out of 20 cycles of the frequency divider 14. In this case, Fo is derived as follows:

*Fo* = 6,125,000 (1/174 − 1/88 (1/2 + 17/20 1/174)) Hz
= 6,125,000 (1/174−1/176−1.7/174 (176) ) Hz
= 6,125,000 (176 − 174 − 1.7/174(176)) Hz
= 6,125,000 (3/20 2/174(176)) Hz
= 3/20(400) Hz
= 60 Hz

Provision of a frequency divider 29 providing a fractional divisor N3 is accomplished by well-known means. The particular divisors N1 and N2 are selected to provide the first output frequency Fo as desired. In the present embodiment, the high clock frequency fc and the particular divisors utilized to provide an Fo 400 Hz are chosen such that the resulting output at the terminal 21 has a high ripple frequency which is easily filtered at the utilization means (not shown). Other divisors, of course, could be chosen. The purpose of the means 25 is to modify the number of pulses supplied by the channel 10 to the input 18 so that a different divisor is selected. This means 25 for modifying the number of pulses could take any number of forms and could comprise means for decreasing the number of pulses provided to the input 18 as well as increasing the number thereof.

An example of a preferred form which the means 25 can take is illustrated in FIG. 2 in which a J-K flip-flop 35 is provided having a clock input terminal 36 coupled to the output of the clock source 1. The J-K flip-flop 35 is a gate coupling further input pulses into the channel 10. The Q terminal 37 is connected to the input of the frequency divider 12. The J-K flip-flop also has the Q terminal 38 and a reset terminal 39. The J-K flip-flop 35 is a well-known logic circuit which changes state once at the Q terminal 37 for one input pulse and returns to its original state at the second pulse. The output at the Q terminal 38 is the complement of the output of the Q terminal 37. A pulse applied to the reset terminal 39 sets a state of the Q terminal at zero. NAND gates 42, 43 and 44 are provided. The NAND gate 42 has inputs connected thereto from the frequency divider 14, Q terminal 38, and the output of the NAND gate 44. The output terminal of the NAND gate 42 is connected to the reset terminal 39 and an input of the NAND gate 43. Another input of the NAND gate 43 is connected to the output of the NAND gate 44. The inputs to the NAND gate 44 comprise the outputs of the NAND gate 43 and the frequency divider 29. The J-K flip-flop 35 incorporates the functions of both the divide by 2 flip-flop 27 and the OR gate 28 of FIG. 1.

Figure 3:
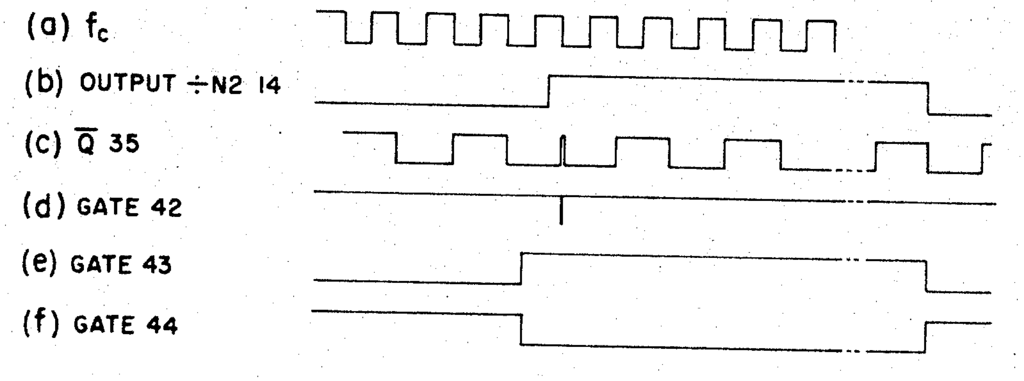
FIG. 3 is a waveform chart useful in understanding of the operation of the circuitry of FIG. 2.

The operation of the means 25 is illustrated by FIG. 3 in which FIG. 3*a* represents the clock frequency *fc*, FIG. 3*b* represents the output of the frequency divider 14, FIG. 3*c* is a representation of the output at the Q terminal 38 of flip-flop. The output supplied by the Q terminal 37 to the frequency divider 11 is a wave form which would be represented by the complement of the wave form represented in FIG. 3*c*. FIGS. 3*d,e* and *f* are representations of the outputs of the NAND gates 42, 43 and 44 respectively. It is noted that in the representation of FIG. 3, there is a broken line utilized to indicate that for purposes of the drawing, the width of a cycle in FIG. 3 has been condensed since one cycle in FIG. 3 is 174 times as wide as one cycle of FIG. 3*a*.

The three NAND gates 42, 43 and 44 are connected as a digital differentiator to generate a narrow pulse to set the flip-flop 35 once for each pulse coming from the frequency divider 29. As seen in FIG. 3 at time to, a pulse from the frequency divider 29 is initiated, and the NAND gate 42, 43 and 44 operate to provide a reset pulse at the terminal 49 so that at time *t1*, an extra pulse is coupled to the channel 10 and to the input of the frequency divider 12. The connection from the Q terminal 38 to the NAND gate 42 assures that the reset pulse provided to the terminal 39 occurs when Q terminal 37 has a zero at its output. Thus, no pulses supplied by the means 25 are lost due to coincident input pulses from the clock source 1 and the frequency divider 29.

It is noted that the additional pulse supplied by the means 25 is narrow compared to the pulse supplied by the clock source 1. However, it is the number of pulses applied to the logic circuitry of the present invention and not their width which results in desired operation.

Figure 4:
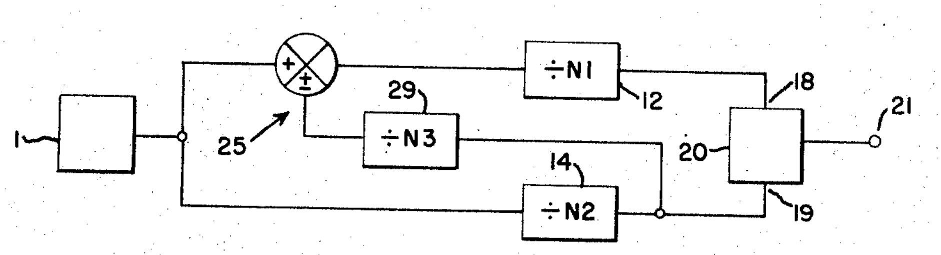
FIGS. 4 and 5 are block diagrammatic representations of further forms of the present invention.
Figure 5:
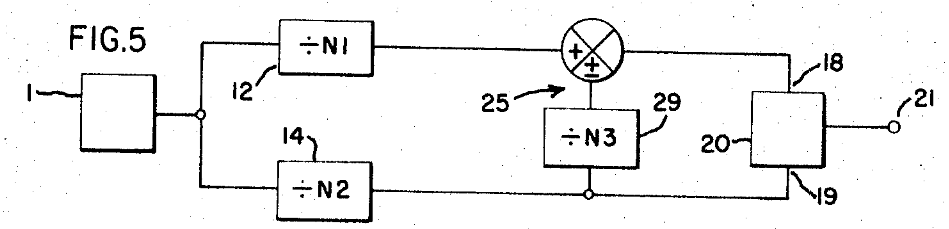

Referring now to FIGS. 4 and 5, in which the same reference numerals are used to denote elements corresponding to those of FIG. 1, it is seen that any convenient means may be utilized to modify the number of input pulses to the discriminator 20. As stated above, the number of pulses supplied to the discriminator 20 may be modified by blanking or adding to pulses provided by the frequency divider 12. This is indicated in FIGS. 4 and 5 by a gate 40 labeled with a plus or minus sign to indicate that the gate may be an AND or OR gate or other well-known form of gate which comprises means for coupling or blocking pulses. The term gate as used here may be any sutiable means for coupling or blocking pulses. Additionally, the means 25 may be coupled to the input or the output of the frequency divider 12 as illustrated in FIGS. 4 and 5 respectively.

What is thus provided is a multiple frequency reference generator in which an output frequency is selected by modifying in a selected manner a predetermined number of pulses provided to a discriminator. Separate frequency sources may be used, or frequency dividers coupled to a single source may be utilized to provide the desired numbers of pulses. Differing forms of the present invention have been illustrated such that many forms of the present invention will suggest themselves to those skilled in the art.

What is claimed is:

1. In a reference wave generator including first and second frequency sources providing signals of first and second frequencies respectively, said signal of first and second frequencies being coupled to first and second inputs of a discriminator providing an output having a frequency equal to the difference of said first and second inputs: means for selectively varying said output frequency signal to produce integral or non-integral sub-multiples of the said output frequency including a third frequency source coupled to the signal path including said first frequency source and responsive to said second frequency source for modifying the number of input cycles applied to said first discriminator input, whereby the output frequency of said discriminator is modified to produce a modified output frequency which may be either an integral or non-integral sub-multiple of the output frequency.

2. A reference wave generator comprising, in combination:

a. a clock source for producing signals of a first frequency;
b. a first frequency divider connected to said clock source for dividing said first frequency signal by a first factor to produce a signal of a second frequency;
c. a gate means having a first input and an output said gate means having its first input connected in series with said first frequency divider;
d. a second frequency divider connected to said clock source for dividing said first frequency signal by a second factor to produce a signal of a third freuqency;
e. a discriminator having first and second inputs and an output, the first and second inputs of said discriminators being connected to receive the output of said first and second frequency dividers to produce an output having a frequency equal to the difference between the frequencies of said first and second signals;
f. means connected to the second input of said gate means and responsive to the signal of said third frequency for modifying said second frequency supplied to the first input of said discriminator whereby the output frequency of said discriminator is varied as said second frequency is modified to provide a modified output which is either an integral or non-integral sub-multiple of the original output frequency.

3. A system according to claim 2 in which said means connected to the second input of said gate comprises a frequency divider having an input connected to the output of said second frequency divider to modify the frequency of the signal from said first frequency divider selectively in response to a predetermined number of cycles of the output from said second frequency divider, said last named frequency divider having an output connected to said gate.

4. A system according to claim 3 in which said gate comprises an OR gate.

5. A system according to claim 3 in which said gate comprises an AND gate.

6. A system according to claim 2 in which said gate is connected between said clock source and said first frequency source.

7. A system according to claim 2 in which said gate is connected between said first frequency divider and said discriminator.

8. A system according to claim 3 in which said gate is connected between said clock source and said first frequency source.

9. A system according to claim 3 in which said gate is connected between said first frequency divider and said discriminator.

10. A reference wave generator comprising, in combination:

a. a clock source for producing a pulse train having a first frequency;
b. a first frequency divider connected to said clock source for dividing the pulse train of said first frequency by a first factor to produce a pulse train of a second frequency;
c. a second frequency divider connected to said clock source for dividing the pulse train of said first frequency by a second factor to produce a pulse train of a third frequency;
d. a discriminator having first and second inputs and an output, the outputs of said first and second frequency dividers being coupled to the inputs of said discriminator to produce an output having a frequency equal to the difference frequency;
e. means coupled to said first frequency divider and responsive to selected output pulses from said second frequency divider for modifying the number of pulses coupled to the first input of said discriminator to produce a modified pulse train having a frequency which may be either an integral or non-integral sub-multiple of the output frequency.

11. A reference wave generator according to claim 10 in which said means for modifying the number of the pulses coupled to the first input of said discriminator comprises means for adding pulses to said first frequency divider.

12. A reference wave generator according to claim 10 in which said means for modifying the number of the pulses coupled to the first input of said discriminator comprises means for blocking pulses coupled from said first clock source to said frequency divider.

* * * * *